United States Patent [19]
Toy

[11] Patent Number: 5,095,973
[45] Date of Patent: Mar. 17, 1992

[54] HEAT EXCHANGERS

[76] Inventor: William W. Toy, 511 Andros La., Indian Harbour Beach, Fla. 32937

[21] Appl. No.: 630,832

[22] Filed: Dec. 20, 1990

[51] Int. Cl.$^5$ .......................... F28F 7/00; H01L 23/36
[52] U.S. Cl. .................................. 165/185; 29/390.03; 361/386
[58] Field of Search .......................... 165/185; 361/386; 29/890.03

[56] References Cited

U.S. PATENT DOCUMENTS

| | | | |
|---|---|---|---|
| 3,148,511 | 9/1964 | Gable | 165/185 |
| 4,114,593 | 9/1978 | Guertin | 165/185 |
| 4,577,678 | 3/1986 | Frauenfeld et al. | 165/905 |

FOREIGN PATENT DOCUMENTS

| | | | |
|---|---|---|---|
| 32073 | 3/1979 | Japan | 165/185 |
| 215755 | 12/1984 | Japan | 29/890.03 |

Primary Examiner—Albert W. Davis, Jr.
Attorney, Agent, or Firm—Alvin S. Blum

[57] ABSTRACT

A metallic assembly transfers heat from a hot surface in contact with a heat source to specially shaped air passageways where cooling air is blown through. The air passageways in the metal assembly are arranged with a large metal surface area in contact with the cooling air for efficient heat transfer with low resistance to air flow. The passageways are formed by stacks of streamlined posts alternating with fins. The alternating layers are formed separately, stacked together, compressed, and subjected to hot dip brazing. This melts a low melting layer of cladding metal between metal layers to form the assembly into an integral assembly with efficient heat transfer between layers with reduced manufacturing costs.

13 Claims, 2 Drawing Sheets

HEAT EXCHANGERS

BACKGROUND OF THE INVENTION

The invention relates to heat exchangers and method of their manufacture and more particularly to heat exchangers for cooling electrical devices in which heat is removed by a metallic element by conduction and transferred to a moving gas stream by presentation of a large surface area of the metallic element to the gas stream.

Electrical devices often produce heat as an unwanted byproduct of their operation. The heat must be removed from the apparatus to prevent elevation of the temperature to undesirable levels. In some cases, air is blown directly over the heat producing elements. When this is ineffective or undersirable, special heat exchangers may be used for more effective transfer of the heat.

These may take the form of a metal heat sink to which the heat producing element is thermally coupled. The heat sink or exchanger may have a flat surface for coupling to a flat surface of the element. Often a heat-conducting paste between the two surfaces ensures good heat transfer. The exchanger is provided with a large surface area exposed to the cooling air. This large surface may be in the form of ridges, fins and the like. The cooling air may be moved by simple convection, however it is more common to force air by a fan or blower. The preferred, compact and inexpensive blowers for this purpose are the pancake type of fans as exemplified by: Model 148VK-0282 manufactured by ETRI INC., Monroe, N.C.

They move considerable volumes of air, but only at low pressure. They will not operate effectively into a high resistance to air flow. Many of the heat exchangers of the prior art present a large surface area but offer so much resistance to air flow that they cannot be used with a pancake fan. Furthermore, it is expensive to manufacture a low resistance heat exchanger with a large heat transfer capability.

SUMMARY OF THE INVENTION

It is accordingly an object of the invention to provide a heat exchanger with high efficiency of heat transfer between a conductive metal element and a moving gas stream that presents low resistance to gas flow. It is another object of the invention to provide such a heat exchanger that is inexpensive to manufacture so that the combination of heat exchanger and air fan will provide low cost cooling of electrical apparatus.

The equation for Q, the heat transferred from one face of a solid to a fluid is:

$$Q = \frac{t_1 - t_2}{1/hA_1 + L/kA_2}$$

where $A_2$ is the average area of the heat path thru the solid:
$t_1$ is the face temperature
$t_2$ is the fluid temperature
h is the surface coefficient of heat transfer
L is the length of the heat path thru the solid
k is the thermal conductivity of the solid $A_1$ is the area of the fluid/solid interface Q is the transferred heat.

In practice this equation must be integrated to account for the changes in area within the design. It is presented here to show the importance of A and L in the denominator. In the invention A has been kept large by blocking the air flow with streamlined members. The streamlined members, or posts, cause the recovery of a large part of the energy used to accelerate the air because of the blockage. Only a one time acceleration of the air is desirable because the efficiency of the streamlining is less than one and when multiple accelerations are used the efficiencies multiply to get the over all efficiency. The over all efficiency is therefore lower, if there are multiple accelerations and decelerations. Accelerating the air within the heat exchanger is highly desirable because it has the effect of "ironing out" the gas to expose more air molecules to a given surface area and the higher velocity of laminar flow aids in heat transfer at the surface. Turbulent flow in any part of the system limits air flow available with a given fan configuration. If turbulence is to occur, it should occur within the heat exchanger only. All turbulence elsewhere is wasted fan energy. The invention accelerates the air 60% to ensure that turbulence due to a high Reynolds number will occur first within the heat exchanger. The 60% has the effect of increasing the Reynolds number 60% since velocity is a multiple term in the Reynolds number group. In practice it may be desirable to keep the flow within the heat exchanger laminar depending on the fan output available.

When air flows between two surfaces the boundary layer accounts for the h in the above equation. This boundary layer is present in both laminar and turbulent flow. Turbulent flow has the effect of punching thru this layer for better heat transfer. One of the features of the invention is the coining of small ridges on the fins placed at an angle to the air flow. These ridges have the effect of breaking thru the boundary layer and increasing the area of the fin as well.

All of the above would be of little practical value unless it could be made economically. In the invention, fabrication is achieved by "stacking" of the airfoil shapes and fins. The airfoil members, or posts, are die cut from aluminum material that is clad on both sides. The cladding is a brazing material used in the aluminum dip brazing process. The fins are die cut and in some cases coined to provide the small ridges. When the fins are coined they may be flattened to assume an airfoil edge both back and/or front. This is to further improve the air flow. The top plate is machined. Holes and pins are provided to hold the assembly in place during dip brazing.

An alternate assembly method is to mill post and fin intergrally from thick plate and stack the assembly as described above.

The economic manufacture is brought about by the "stacking method" that permits minimum, easy and fast machining when the airfoil shapes are machined. Die cutting and coining provides an alternative to machining with reduced scrap. The heat exchanger provides high heat transfer with minimum air flow losses and a low cost of manufacture.

When clad posts and fins are stacked and pressed together and held in place by pins, they are subjected to a brazing process wherein the assembly is heated to a temperature above the melting point of the cladding metal and below the melting point of the substrate aluminum alloy. The cladding that separates the layers melts and fills all voids by capillarity, forming an integral joint with excellent thermal conductivity.

The preferred dip brazing process achieves the high temperature by dipping the assembly in molten salt. The salt protects the hot metal from oxidation. Alternatively, the high temperature may be attained in an oven from which the air has been removed. The stacking of layers of posts and fins with hot dip brazing yields a product equivalent in thermal conductivity to machining the entire assembly out of a block of metal but at greatly reduced cost. Furthermore, having access to the individual elements for processing permits production of complex shapes not readily achieved by machining from a block.

These and other objects, features and advantages of the invention will become more apparent when the following detailed description is studied in conjunction with the drawings.

DETAILED DESCRIPTION OF PREFERRED EMBODIMENTS

Figure 3:
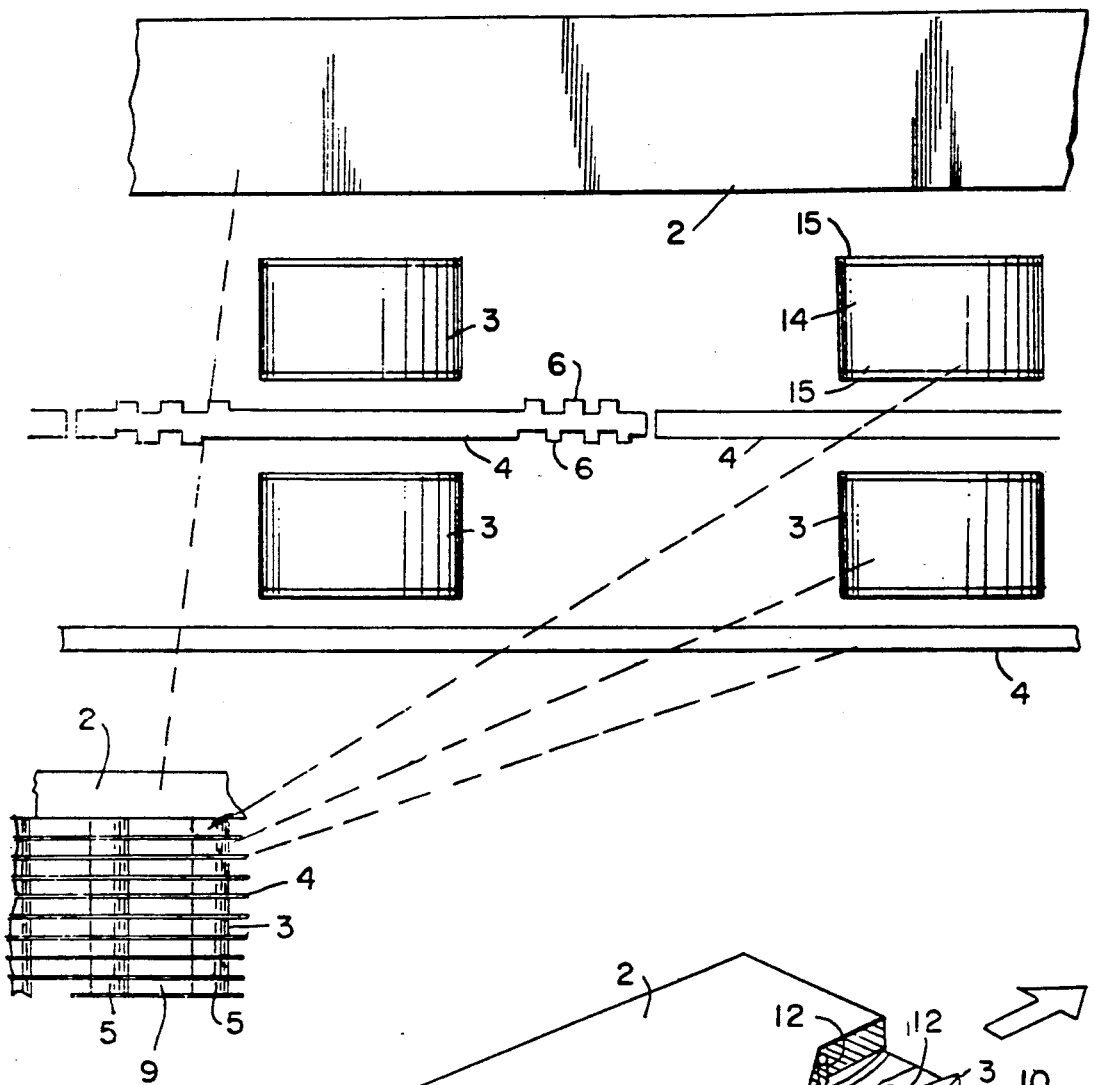
FIG. 3 is a detailed, exploded view of a portion of the heat exchanger.
Figure 1:
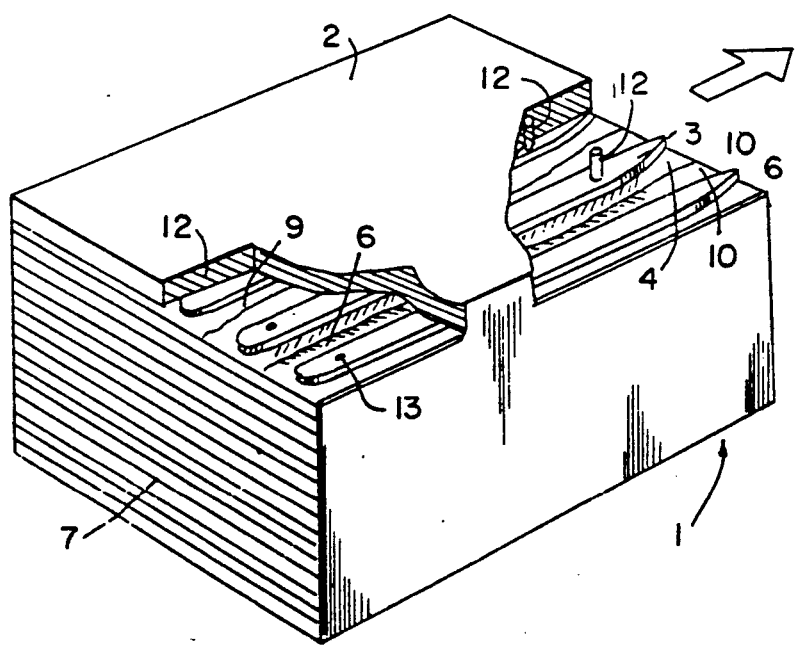
FIG. 1 is a perspective view of the heat exchanger with portions broken away.
Figure 2:
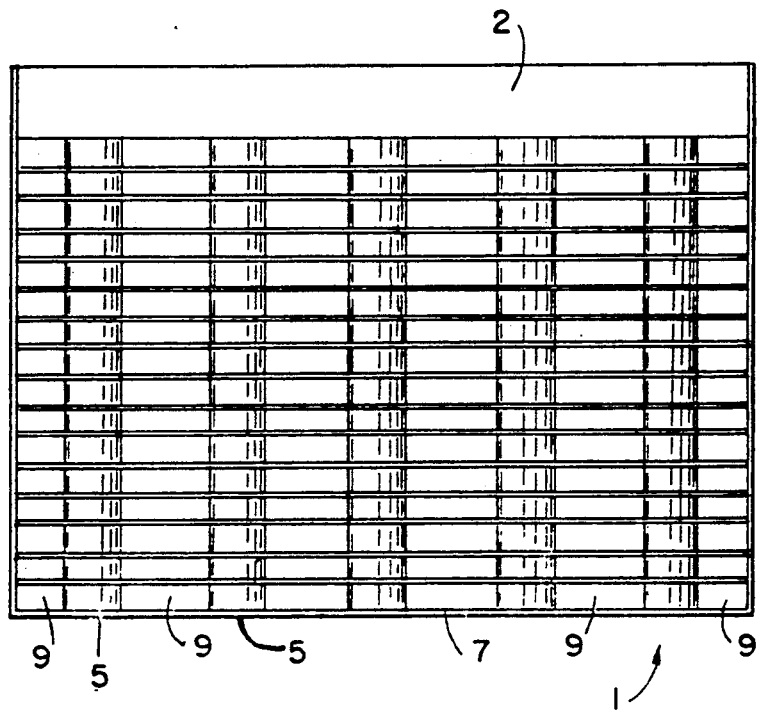
FIG. 2 is a front elevation view of the heat exchanger.

Referring now first to FIGS. 1-3, a heat exchanger 1 has a top plate 2 that is placed in thermal contact with the heat source (not shown). A heat conducting paste or bonding agent may be supplied to ensure good transfer of heat from the source to heat exchanger 1 that is made of a thermally conductive aluminum alloy. Connected to the top plate 2 are stacks 5 or streamlined posts 3, having a length more than five times the width, a round front and tapered rear, alternating with thin plates or fins 4. The fins may be flat or may be embossed with ridges 6 by a coining process to enhance air flow patterns and increase surface area. Cooling air enters the heat exchanger at the front face 7, travels between posts 3 in spaces 9 where is is accelerated sixty percent until the fluid reaches exit spaces 10 where it is decelerated. Air flow direction is indicated by arrow 11. In each air space 9, heat transfers from the metal surfaces of posts 3 and fins 4. Because the gas is only accelerated and decelerated once, there is less pressure drop than other heat exchangers having multiple accelerations and decelerations in series. Furthermore, all of the acceleration takes place at hot metal surfaces where it can be effectively applied to heat transfer. Consequently, the structure is most efficient in providing the objects of high heat transfer efficiency with low air flow resistance.

The fabrication process makes it possible to produce this elegant structure at reduced cost, with several options to suit particular applications. The top plate 2 is machined with holes for holding pins 12. A first layer of stamped, streamlined posts 3, provided with pin holes 13 are put onto pins 12. Then a layer of fins 4 also provided with pin holes are threaded onto the holding pins 12. Successive layers of posts 3 and fins 4 are alternated on the pins to give required height, in this case sixteen layers, with five stacks. The fins may be produced in narrow strips just one stack wide, in which case, there would be five across. This has the advantage of modularity. A wider heat exchanger simply has more of the same width fins. There are no added costs for a new tool for stamping out fins.

Alternatively, a single wide fin may be provided that extends across all five stacks. In an alternative embodiment, both post 3 and fin 4 are produced in one piece, such as by machining. As best seen in FIG. 3, the various pieces may be processed from clad sheet stock having a high temperature base aluminum alloy 14 clad on one or both faces with a low temperature alloy 15 that melts and joins the parts intimately.

Figure 4:
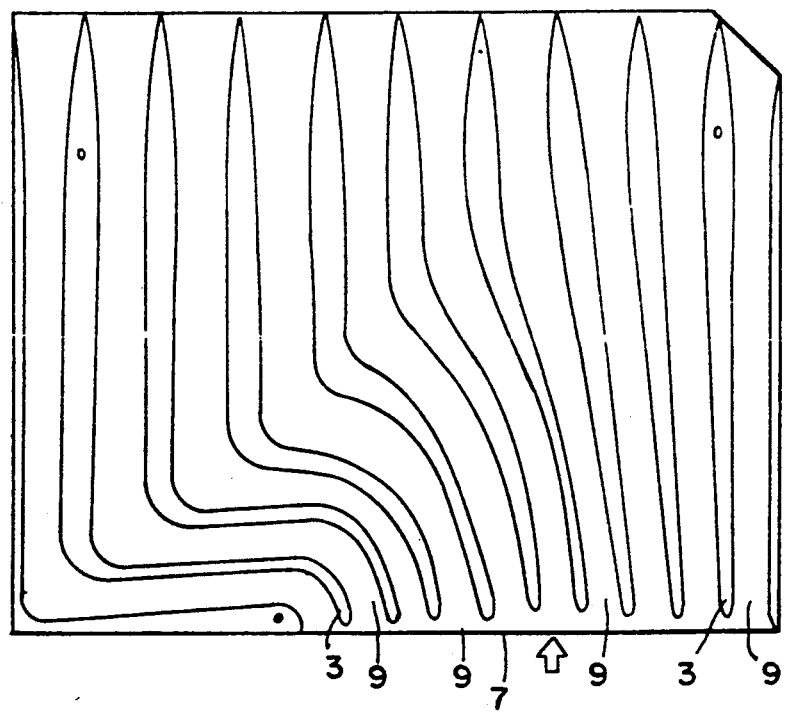
FIG. 4 is a plan view of a machined plate-with-posts element of another heat exchanger of the invention.

FIG. 4 shows an embodiment of the invention in which a narrow input air duct is provided with a heat exchanger of a greater width. The posts 3 are arranged to spread the narrow input air stream into a wider patterhn with minimal pressure drop by streamlined flow pathways, from narrow input front face 7 to broad exit face 16.

The above disclosed invention has a number of particular features which should preferably be employed in combination although each is useful separately without departure from the scope of the invention. While I have shown and described the preferred embodiments of my invention, it will be understood that the invention may be embodied otherwise than as herein specifically illustrated or described, and that certain changes in the form and arrangement of parts and the specific manner of practicing the invention may be made within the underlying idea or principles of the invention within the scope of the appended claims.

I claim:

1. A heat exchanger of the type transferring heat from a first metal surface through a metal assembly to a second metal surface having an extended area to transfer heat to a flowing fluid surface contacting said second extended area, said heat exchanger comprising:
   a) a metal plate having two broad, opposed faces, a first face providing said first metal surface for application to a heat source;
   b) a plurality of metal stacks applied to a second face of said plate to provide a plurality of fluid channels through said heat exchanger, each channel bounded by metal to provide an extended metal surface area for transfer of heat from metal to fluid;
   c) said stacks comprised of alternate layers of elongate, streamlined post members and elongate fin elements, in which said post members are narrower than said fin elements, whereby said fluid channels are defined by the space between adjacent post members and bounded by adjacent fin elements; and
   d) in which said plate, said post members and said fin elements are intimately joined together by fastening means for enhanced transfer of heat therebetween.

2. The heat exchanger according to claim 1, in which said fastening means are hot dip brazing, and said metal is aluminum.

3. The heat exchanger according to claim 1, in which said post members have straight smooth elongate sides and streamlined front and trailing ends to provide acceleration of said fluid into said fluid channels and deceleration at the exit of said fluid channels.

4. The heat exchanger according to claim 1, in which a layer comprised of a fin element and a post member are integrally formed from a single plate by machining away a portion of the plate to form said post member resting on said fin element.

5. The heat exchanger according to claim 1, in which said post members are at least five times longer than they are wide.

6. The heat exchanger according to claim 1, in which ridges are provided on the surfaces of said fin elements for enhanced heat transfer.

7. The heat exchanger according to claim 6, in which said ridges are arranged diagonally to the longitudinal axis of said fluid channels.

8. The heat exchanger according to claim 1, in which certain of said post members have streamlined front and trailing ends to provided acceleration of said fluid into said fluid channels and deceleration at the exit of said fluid channels and smooth curved sides to provide curving fluid channels and a heat exchanger with a small fluid entrance and a larger fluid exit.

9. The heat exchanger according to claim 1, in which said fluid is air.

10. A heat exchanger for transferring heat from a heat source through a metal assembly to a large surface area in contact with a moving cooling fluid, said metallic assembly comprising:
    a) a plurality of elongate post members composed of thermally conductive metal, each having streamlined leading and trailing ends, smooth elongate sides and flat top and bottom;
    b) a plurality of elongate fin elements, each having a thickness less than that of said post members and a width greater than that of said post members, said fin elements composed of thermally conductive metal;
    c) a plurality of stacks of alternating layers of said post members and said fin elements thermally bonded together to provide a thermally conductive path through each said stack, whereby said fin elements are spaced apart by said post members;
    d) a thermally conductive metal plate having first and second broad opposed faces, said first face arranged for thermal contact with said heat source and said second face having a plurality of said stacks thermally bonded thereon and arranged in side by side relationship, whereby said fin elements are juxtaposed, and adjacent ones of said post members are spaced apart to provide elongate fluid channels therebetween, said fluid channels bounded top, bottom and sides by thermally conductive metal, each channel having a streamlined entrance at the front of said heat exchanger defined by said streamlined leading ends which act to accelerate said fluid in said channel, and exit defined by said trailing ends which act to decelerate said fluid at the exit to said heat exchanger.

11. The heat exchanger according to claim 10, in which said fin elements are provided with ridges for enhanced heat transfer.

12. The heat exchanger according to claim 10, in which said metal is aluminum with a first melting point and said metal plate, said post members and said fin elements are thermally bonded together by brazing with a thin layer of aluminum with a second melting point lower than said first melting point.

13. The heat exchanger according to claim 12, in which said brazing is of the hot dip brazing type.

* * * * *